(12) United States Patent
Kocon et al.

(10) Patent No.: US 6,188,105 B1
(45) Date of Patent: Feb. 13, 2001

(54) HIGH DENSITY MOS-GATED POWER DEVICE AND PROCESS FOR FORMING SAME

(75) Inventors: Christopher B. Kocon, Plains; Jun Zeng, Mountaintop, both of PA (US)

(73) Assignee: Intersil Corporation, Palm Bay, FL (US)

( * ) Notice: Under 35 U.S.C. 154(b), the term of this patent shall be extended for 0 days.

(21) Appl. No.: 09/283,531

(22) Filed: Apr. 1, 1999

(51) Int. Cl.[7] .......................... H01L 29/76; H01L 29/94; H01L 31/062; H01L 31/113; H01L 31/119

(52) U.S. Cl. .......................... 257/330; 257/327; 257/328; 257/329; 257/332; 438/212; 438/270; 438/271

(58) Field of Search .................................. 257/327, 328, 257/329, 330, 332

(56) References Cited

U.S. PATENT DOCUMENTS

| | | | |
|---|---|---|---|
| 4,964,080 | * 10/1990 | Tzeng | 365/185 |
| 5,072,276 | * 12/1991 | Malhi et al. | 357/42 |
| 5,504,360 | * 4/1996 | Tokura et al. | 257/342 |
| 5,693,569 | * 12/1997 | Ueno | 437/23 |
| 5,844,273 | * 12/1998 | Konishi | 257/331 |
| 5,877,538 | 3/1999 | Williams . | |

FOREIGN PATENT DOCUMENTS

| | | |
|---|---|---|
| 0 381 268 A1 | 8/1990 | (EP) . |
| 0 706 223 A1 | 10/1994 | (EP) . |
| 0 710 988 A2 | 11/1994 | (EP) . |
| 0 726 602 A2 | * 8/1996 | (EP) . |
| 0 747 967 A2 | 12/1996 | (EP) . |
| 63-224260 | 9/1988 | (JP) . |
| 63-244769 | * 10/1988 | (JP) . |
| 1-1236656 | 9/1989 | (JP) . |

OTHER PUBLICATIONS

International Search Report.

* cited by examiner

*Primary Examiner*—Mahshid Saadat
*Assistant Examiner*—Jesse A. Fenty
(74) *Attorney, Agent, or Firm*—Jaeckle Fleischmann & Mugel, LLP

(57) ABSTRACT

A high density MOS-gated device comprises a semiconductor substrate and a doped upper layer of a first conduction type disposed on the substrate. The upper layer comprises a heavily doped source region of the first conduction type and a doped well region of a second and opposite conduction type at an upper surface. The upper surface, which comprises a contact area for the source region, further includes a recessed portion that comprises a contact area for a heavily doped deep body region of the second conduction type in the upper layer underlying the recessed portion. The device further includes a trench gate disposed in the upper layer and comprising a conductive material separated from the upper layer by an insulating layer. A process for forming a high density MOS-gated device comprises providing a semiconductor substrate comprising a doped upper layer of a first conduction type. A doped well region of a second and opposite conduction type is formed in an upper surface of the upper layer, and a dopant of the first conduction type is implanted in the well region to form a heavily doped source region. A layer of nitride is formed on the upper surface of the upper layer, and the nitride layer and upper layer are selectively etched, thereby forming a trench in the upper layer. The trench is lined with an insulating layer, then filled with a conductive material to form a trench gate. The nitride layer is removed, and a layer of interlevel dielectric material is formed on the trench gate and the upper surface of the upper layer. The interlevel dielectric layer is selectively etched, thereby forming a source region contact area. The source region is selectively etched to form a shallow recess that provides a body region contact area. A dopant of the second conduction type is implanted into the recess, thereby forming a deep body region underlying the recess.

34 Claims, 13 Drawing Sheets

HIGH DENSITY MOS-GATED POWER DEVICE AND PROCESS FOR FORMING SAME

FIELD OF THE INVENTION

The present invention relates to MOS devices and, more particularly, to a high density MOS-gated power device and a process for forming same.

BACKGROUND OF THE INVENTION

FIG. 14 is a schematic cross-sectional representation of a trench n-type MOSFET device 100 of the prior art. It has a gate region that includes a trench 108 with gate dielectric 109 located on its sidewalls and floor. Trench 108 is filled with polysilicon 110 serving as a gate electrode. Source connection is achieved through the top metal 112 connected to both the source and body regions 106 and 104, respectively. The back side of the N+ substrate 101 is used as a drain.

N+ source regions 106 are formed in P-well regions 103, which extend to the corners of the trenches and can cause the formation of large electric fields. The P+ body implants 104, which are made are to lower the breakdown voltage of P-wells 103, are large and thus reduce the active area of device 100. Although only one MOSFET is shown in FIG. 14, a typical device consists of an array of them arranged in various cellular or stripe configurations currently used by the industry.

SUMMARY OF THE INVENTION

A high density MOS-gated device of the present invention comprises a semiconductor substrate and a doped upper layer of a first conduction type disposed on the substrate. The upper layer comprises a heavily doped source region of the first conduction type and a doped well region of a second and opposite conduction type at an upper surface. The upper surface, which comprises a contact area for the source region, further includes a recessed portion that comprises a contact area for a heavily doped deep body region of the second conduction type in the upper layer underlying the recessed portion. The device further includes a trench gate disposed in the upper layer and comprising a conductive material separated from the upper layer by an insulating layer.

Further in accordance with the present invention is a process for forming a high density MOS-gated device, said process that comprises providing a semiconductor substrate comprising a doped upper layer of a first conduction type. A doped well region of a second and opposite conduction type is formed in an upper surface of the upper layer, and a dopant of the first conduction type is implanted in the well region to form a heavily doped source region.

A layer of nitride is formed on the upper surface of the upper layer, and the nitride layer and upper layer are selectively etched, thereby forming a trench in the upper layer. The trench is lined with an insulating layer, then filled with a conductive material to form a trench gate. The nitride layer is removed, and a layer of interlevel dielectric material is formed on the trench gate and the upper surface of the upper layer. The interlevel dielectric layer is selectively etched, thereby forming a source region contact area. The source region is selectively etched to form a shallow recess that provides a body region contact area. A dopant of the second conduction type is implanted into the recess, thereby forming a deep body region underlying the recess.

DETAILED DESCRIPTION OF THE INVENTION

Figure 14:
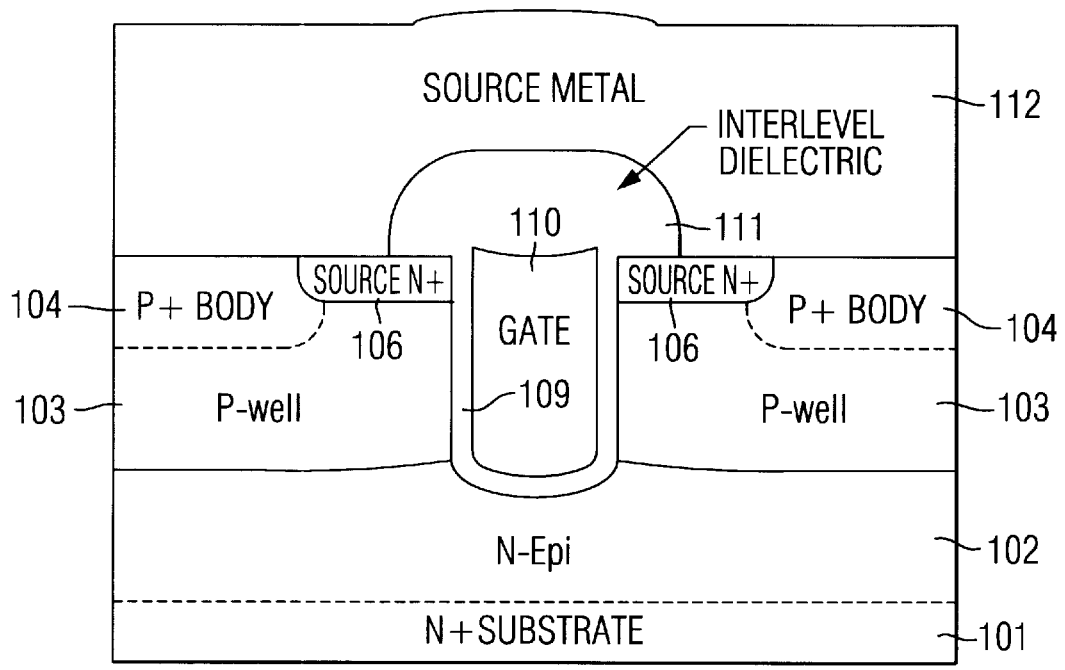
Figure 15:
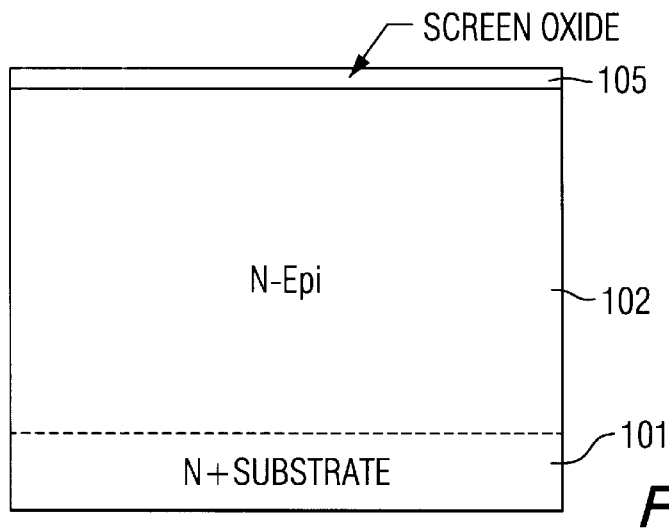
FIGS. 15–25 depicts the steps for forming the P-wells, trench gate, and interlevel dielectric of a MOS-gated device in accordance with the present invention.
Figure 16:
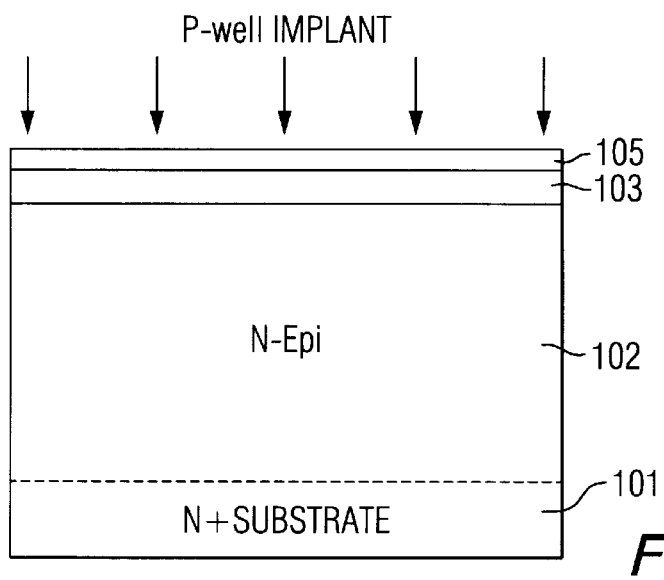
Figure 17:
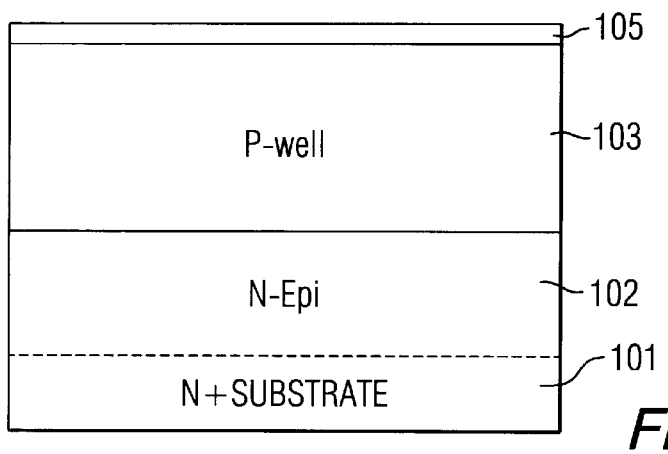

When a device such as that depicted in FIG. 14 is in a blocking (off) state, a positive voltage is applied to the drain terminal, thereby reverse biasing the P well and N drain diode. With no voltage applied to the gate electrode, there is no channel present to allow current to flow between the drain and source electrodes. Since the P-well/N-drain diode is reverse biased, a depletion region containing an electric field is formed. This electric field reaches its maximum at the interface of the P-well silicon with the gate oxide at the trench bottom corner (point 18). If a large electric field is allowed to build at the silicon-oxide interface, the oxide becomes charged by carrier injection, making its breakdown voltage unstable and, in extreme cases, destroying the oxide and causing a gate-drain short. In less destructive cases, ionization is localized close to the device channel area, which reduces the high temperature breakdown voltage of the device and decreases its unclamped inductive switching (UIS) capability.

In order to prevent this from occurring, a deep high concentration P+ body is used to lower the breakdown voltage in the middle of the P-well and move the impact ionization away from the device channel and trench corners. By lowering the breakdown voltage, the critical field at the trench corner at the silicon oxide interface is also decreased. In order to accomplish this deep P+ body design in prior art devices, a separate critical alignment P+ body photoresist step is used to define the P+ area in the middle between trenches, and a higher energy implant combined with a high thermal budget drive is used to diffuse the P+ body deep into silicon. When dopants are diffused vertically in the silicon, they also diffuse laterally with a typical ratio of 80% of its vertical depth. Since the P+ body is formed by a high dose concentration, the device size has to be increased to prevent lateral body diffusion getting into the device channel area. If any of the high P+ dose were allowed to reach the channel, the device threshold would be increased beyond a usable level and become highly variable. Using higher energy (deeper) P+ implants to decrease the required drive thermal budget and reduce device size is not practical because of the high P+ dose required and the limitation on practical implantation energies.

Figure 1:
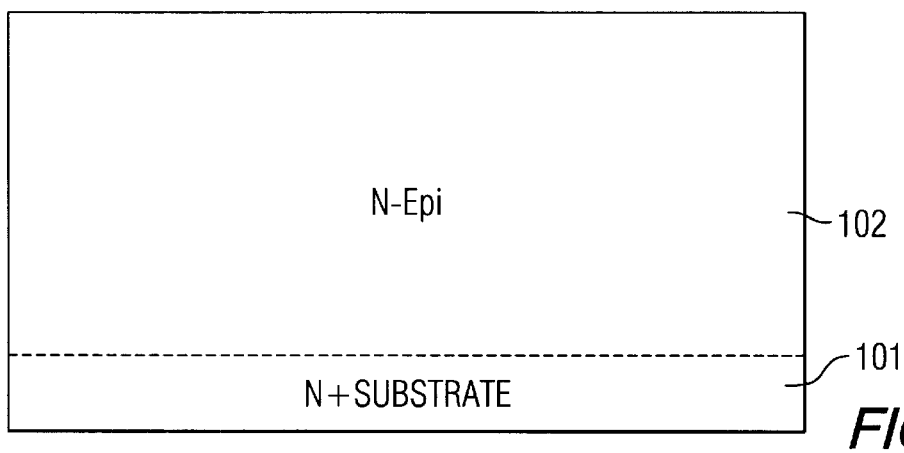
FIGS. 1–14 depict the steps of a prior art process for forming a trench MOSFET. device.
Figure 2:
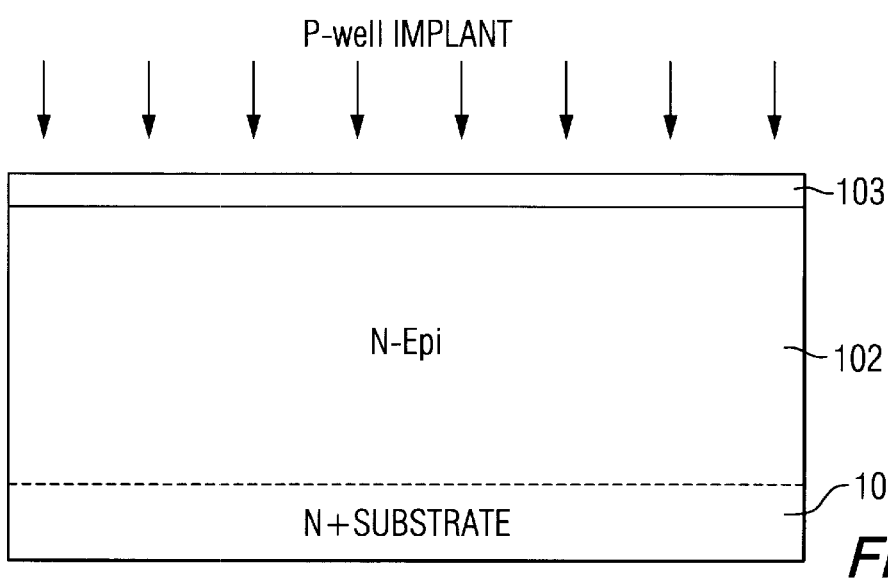
Figure 3:
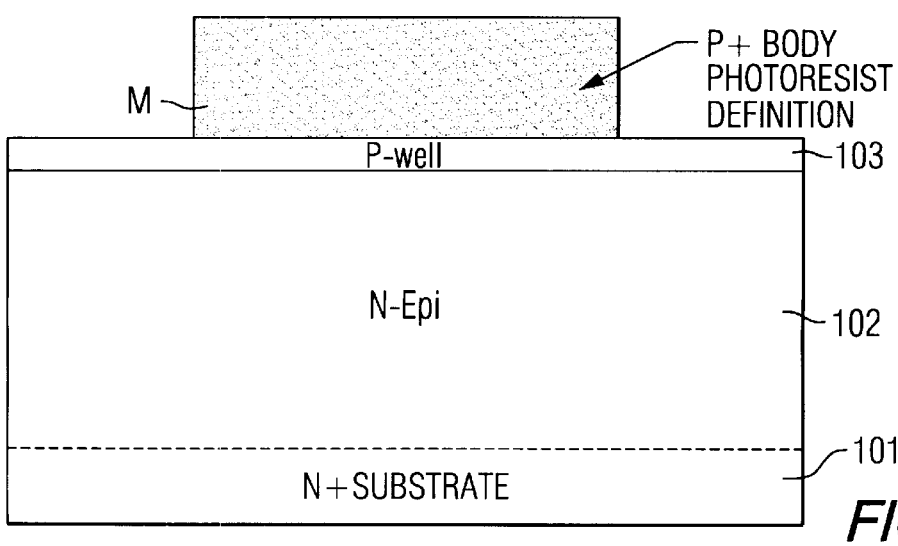
Figure 4:
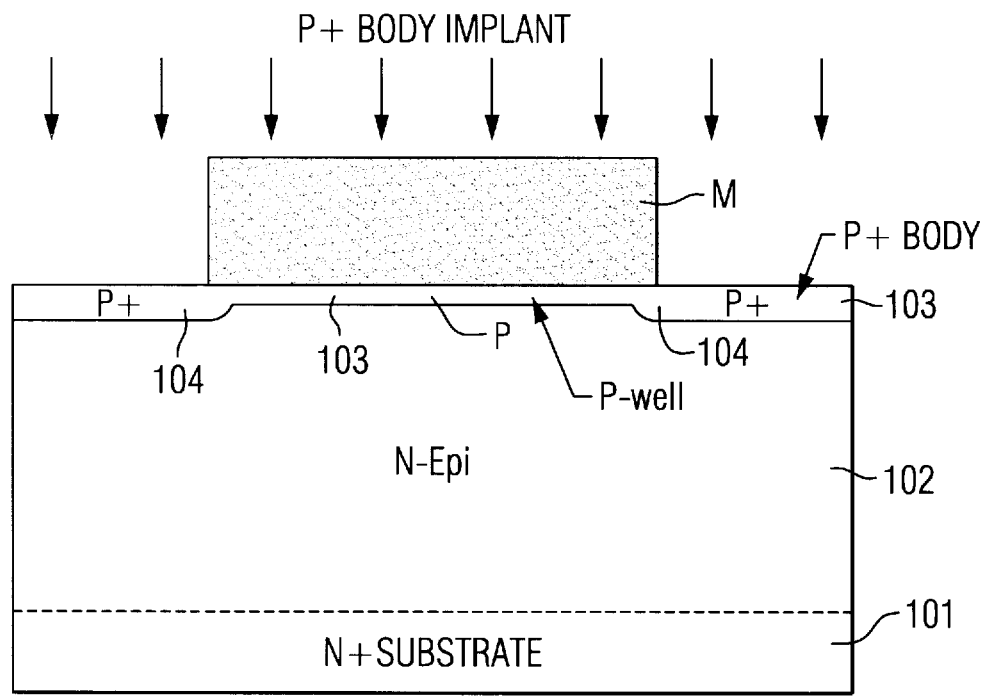
Figure 5:
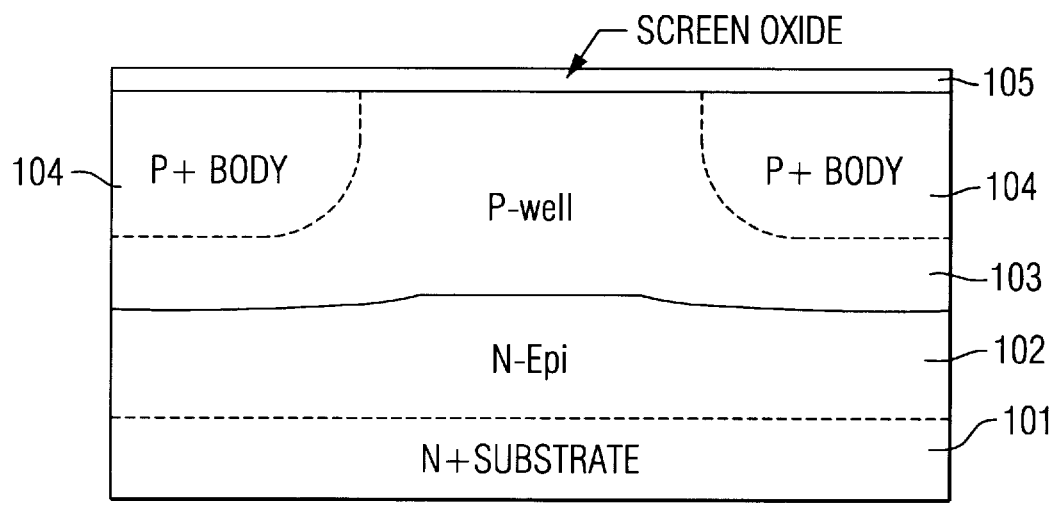

A typical current procedure for building a trench MOSFET device 100 is first to deposit on a highly doped N+ substrate 101 an N-doped epitaxial layer 102 having the thickness and resistivity characteristics needed for a desired breakdown voltage (FIG. 1). Next, a blanket P-well implant is performed, thereby creating a P-well 103 (FIG. 2). A photolithography step using a mask M allows a selective high dose P+ implantation of boron, for example, into P-well 103 to form a P+ body 104 (FIGS. 3 and 4). Following stripping of mask M, a thin screen oxide layer 105 is formed on the wafer, and a high thermal budget processing step is used to drive P+ body 104 and P-well 103 deep into layer 102 (FIG. 5). This high thermal budget step also results in lateral diffusion of highly doped P+ body 104 and requires large additional lateral distance between the subsequently formed trenches to prevent any high P+ doping from reaching the device channel and thereby affecting the device threshold voltage. These lateral distance requirements clearly have an adverse effect on efforts to reduce the size of device 100.

Figure 6:
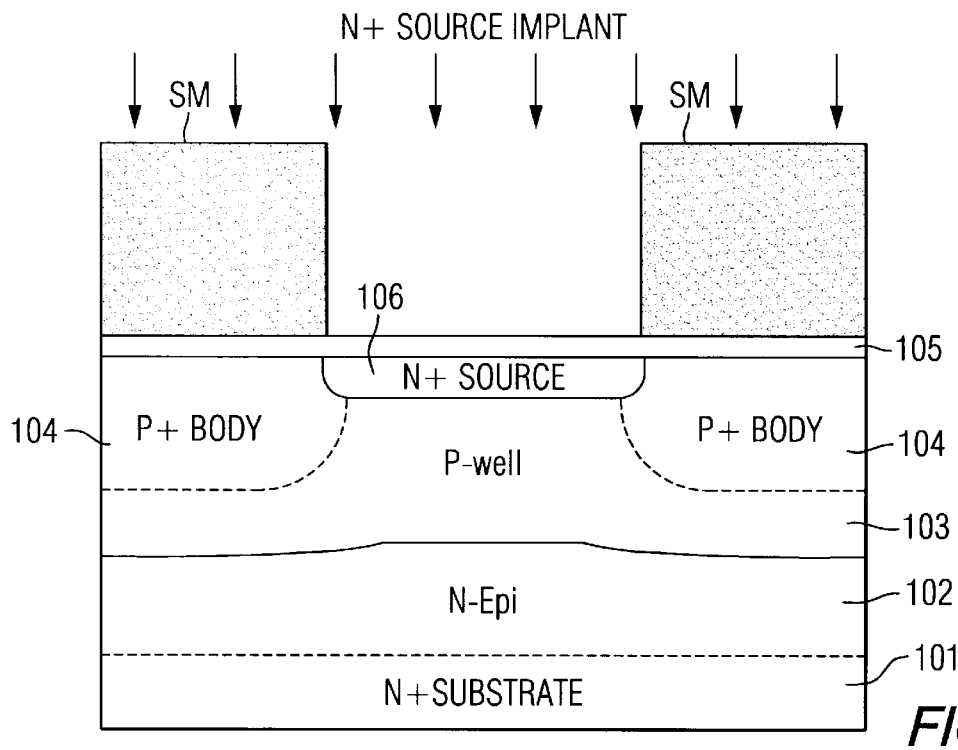
Figure 7:
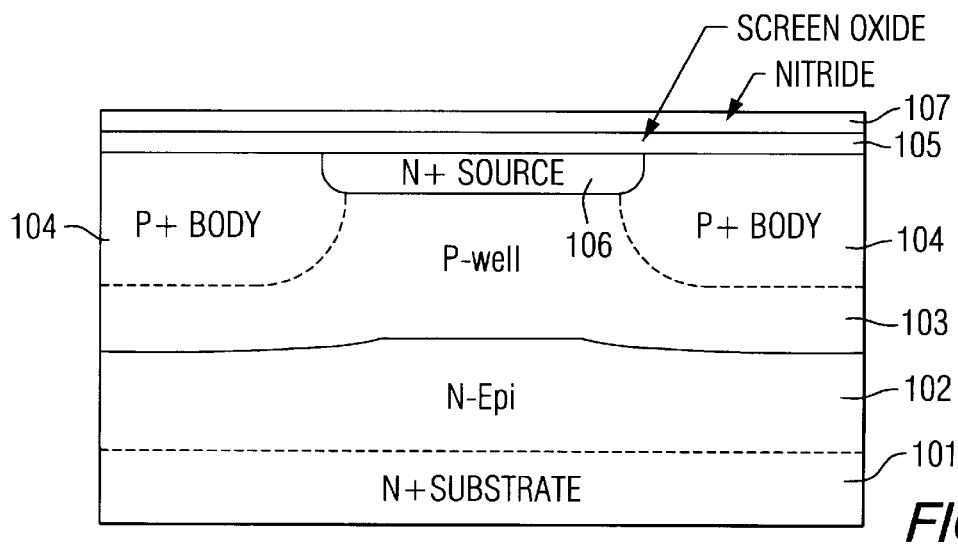
Figure 8:
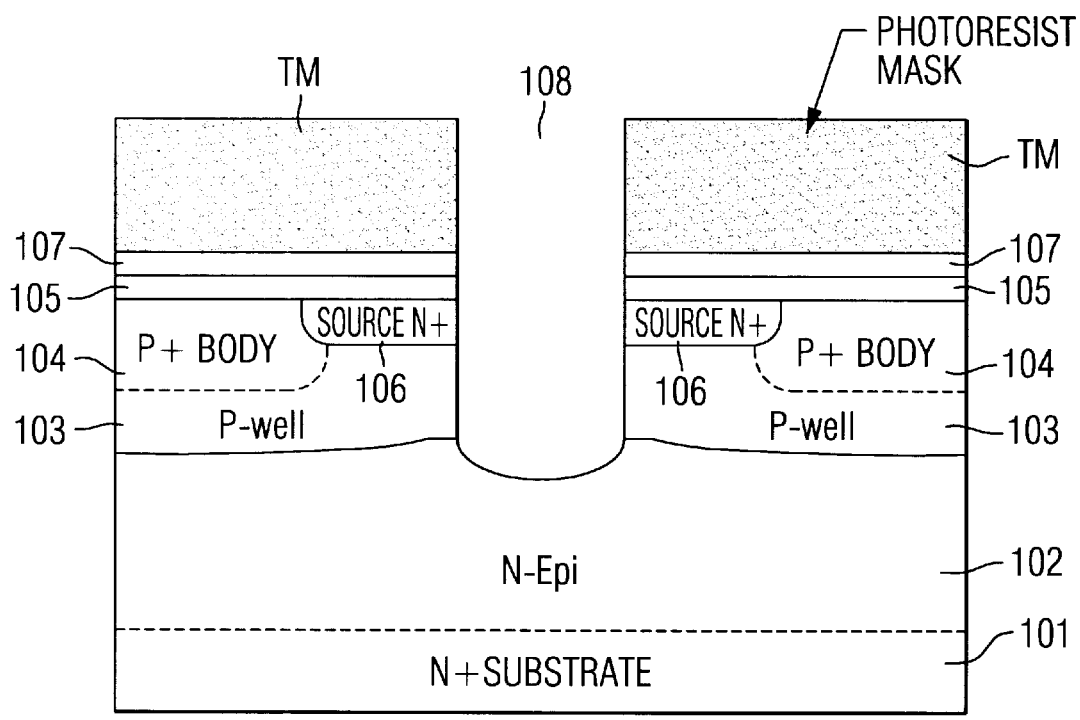
Figure 9:
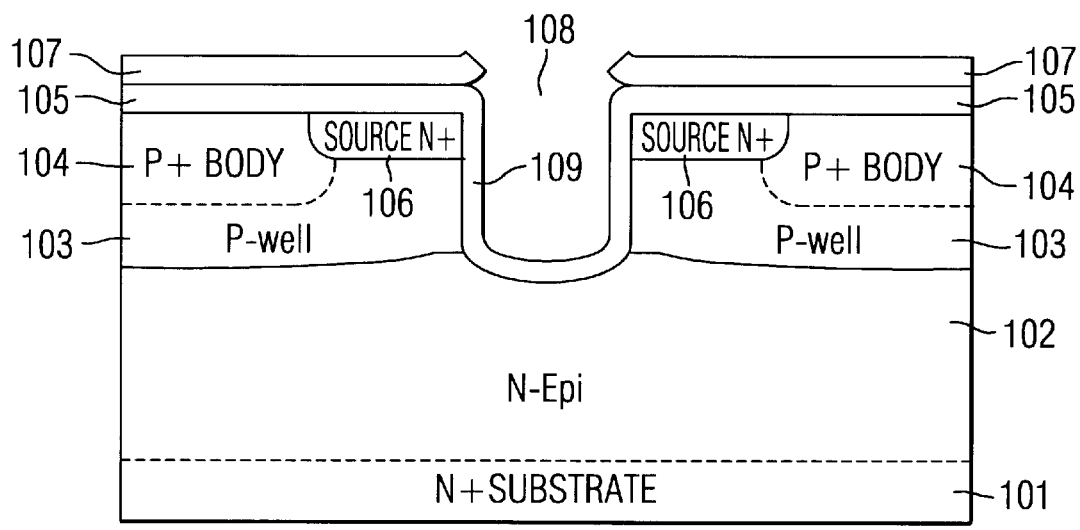
Figure 10:
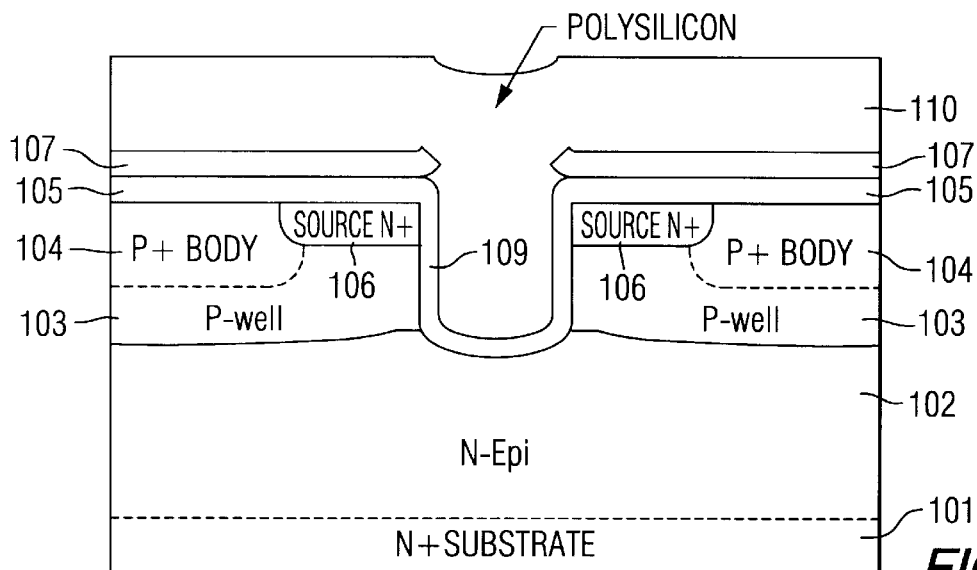
Figure 11:
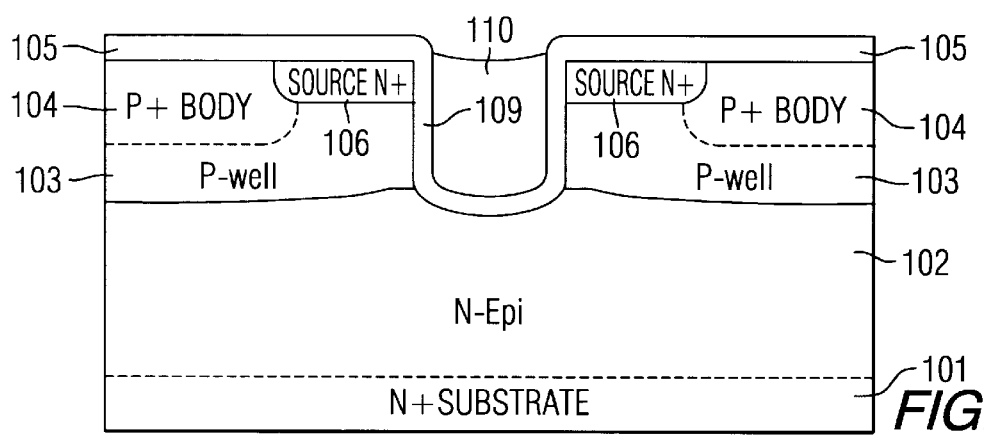

An N+ source 106 aligned to P+ body 104 by a source mask SM is selectively implanted using, for example, arsenic or phosphorus ions and standard photolithographic processing (FIG. 6). A blanket nitride layer 107 is deposited (FIG. 7) to act as a hard mask for the subsequent trench etch. Using a photolithographic trench mask TM, a trench 108 is defined and dry etched by standard procedures (FIG. 8). A gate oxide layer 109 is then grown or deposited in trench 108 to serve as a gate dielectric (FIG. 9). Polysilicon 110 to be used as a gate electrode material is deposited on the whole wafer (FIG. 10). Using a planarization etch, polysilicon 110 is removed from the planar surface but left inside the trench (FIG. 11).

Figure 12:
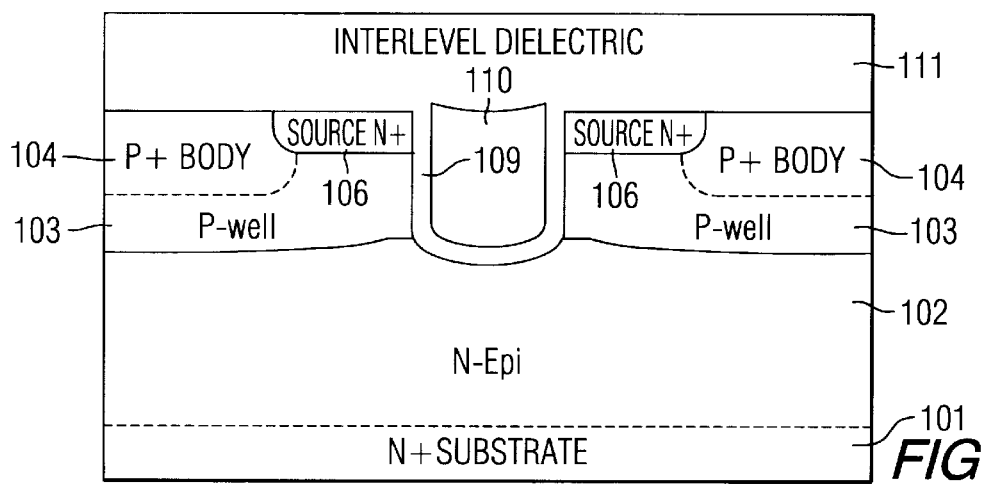
Figure 13:
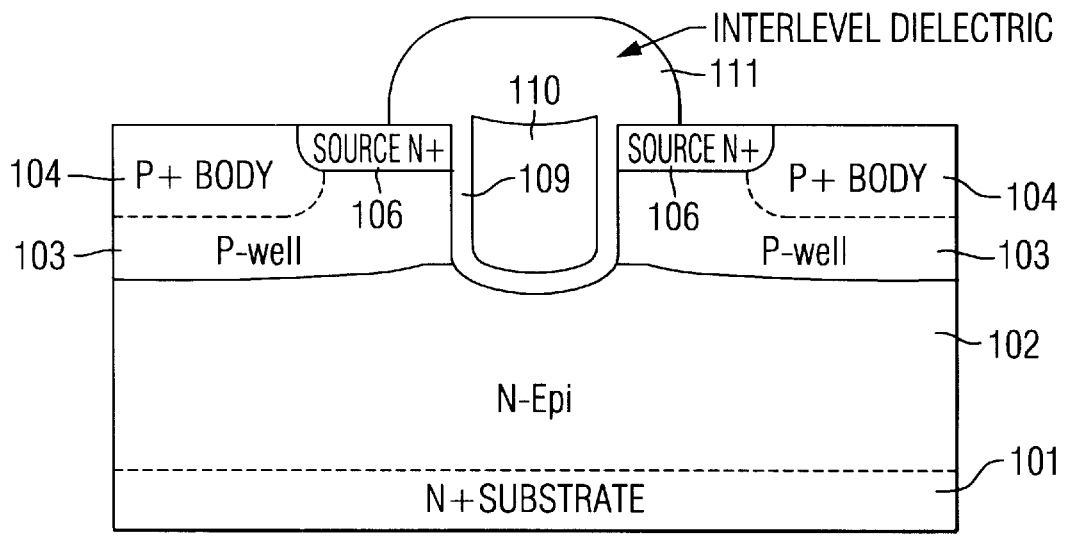

An interlevel dielectric material 111, typically borophosphosilicate glass (BPSG) or phosphosilicate glass (PSG), is deposited on the wafer and selectively etched (FIGS. 12 and 13). The fabrication of prior art device 100 is completed by depositing metal 112 on the top surface of the wafer to serve as a source contact and on the back side (not shown) to serve as a drain contact (FIG. 14).

The size of a device fabricated by the process illustrated in FIGS. 1–14 is substantially controlled by the critically aligned photoresist definition of the P+ Body and the additional critically aligned trench, source, and contact opening steps. Provision must be made in photoresist processing for misalignment tolerances. In addition, the described prior art device requires a high budget thermal diffusion to diffuse the P+ body to the desired depth. The formation of the deep body necessitates additional lateral distance to prevent the highly doped P+ body from coming into contact with the channel. If the body were to reach the channel, the device threshold voltage would be highly variable or even so high as to make the device unusable. Thus, the combination of critical photoresist alignments and deep body implantation severely constrains any effort to reduce the size of a device formed by the above-described process.

The process of the present invention, which enables the size of a device formed thereby to be substantially reduced, is depicted in FIGS. 15–31. It is to be recognized that, although the process is illustrated by a specific flow of steps, variations are contemplated that fall within the scope of the present invention. For example, the sequence of source and well dopant implants and their activation can be altered without affecting the structure and functioning of the final device. Also, the sequence in which the nitride and screen oxide are used and stripped can be varied. Since the nitride is used as a hard masking material, alternative materials such as oxide can be used for the same purpose. The process of the invention is illustrated for an N-channel silicon devices but is also applicable to other devices and other semiconductor materials and dopants. The upper layer in which the device is formed is described as an epitaxial layer, but the upper layer can also be included within the substrate. The described device is a power MOSFET, but other MOS-gated devices, for example, insulated gate bipolar transistors (IGBTs) or MOS-controlled thyristors (MCTs), are also contemplated.

Figure 18:
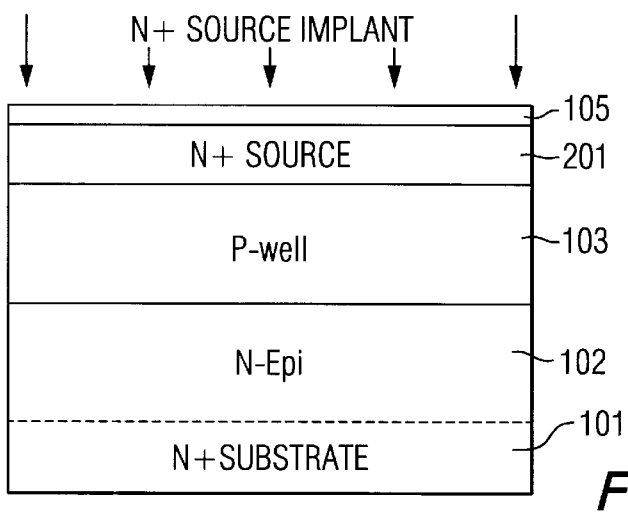
Figure 19:
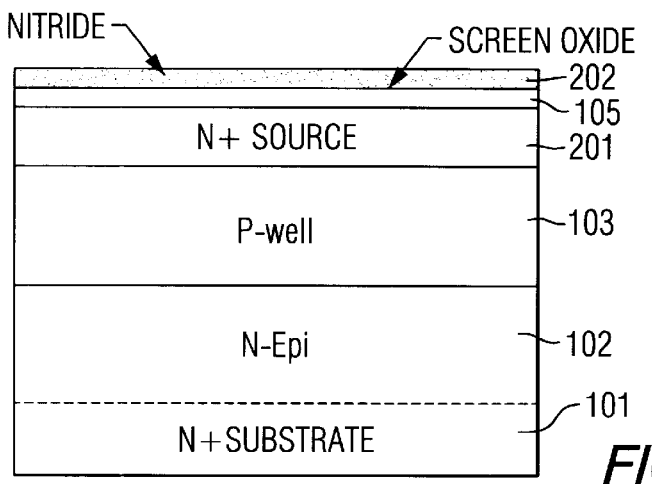
Figure 20:
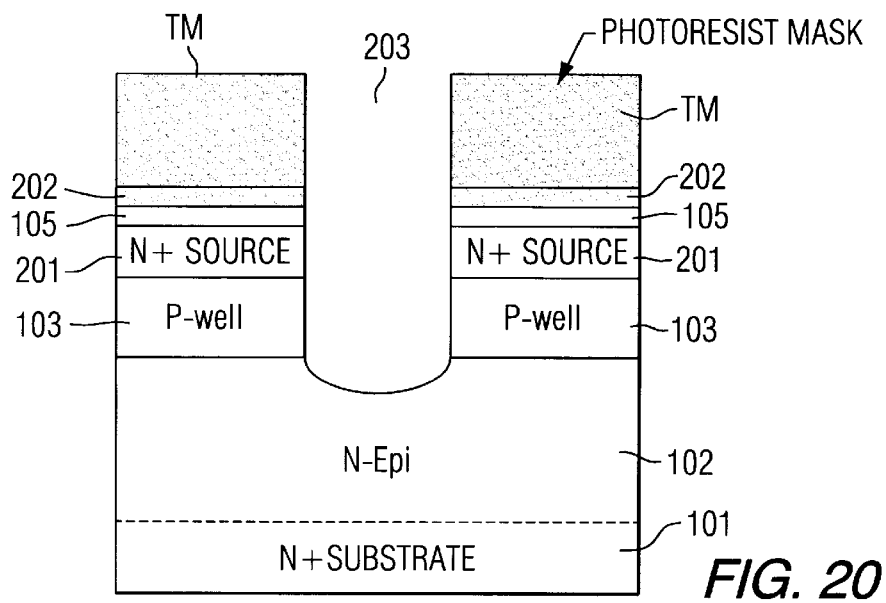
Figure 21:
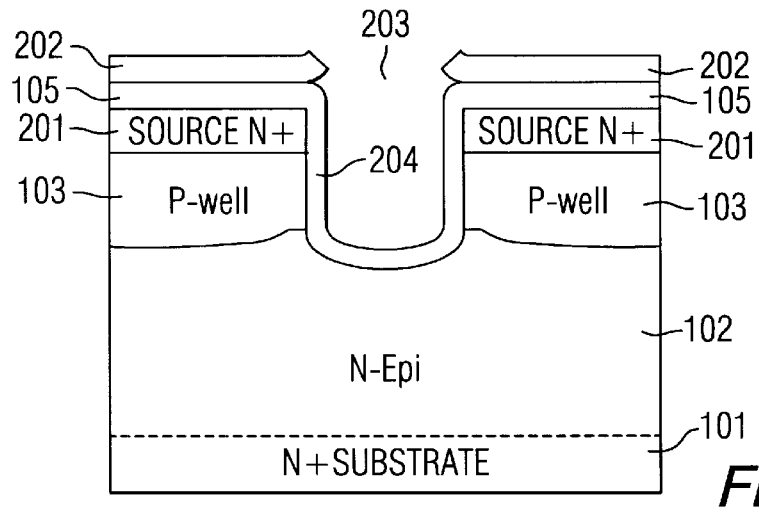
Figure 22:
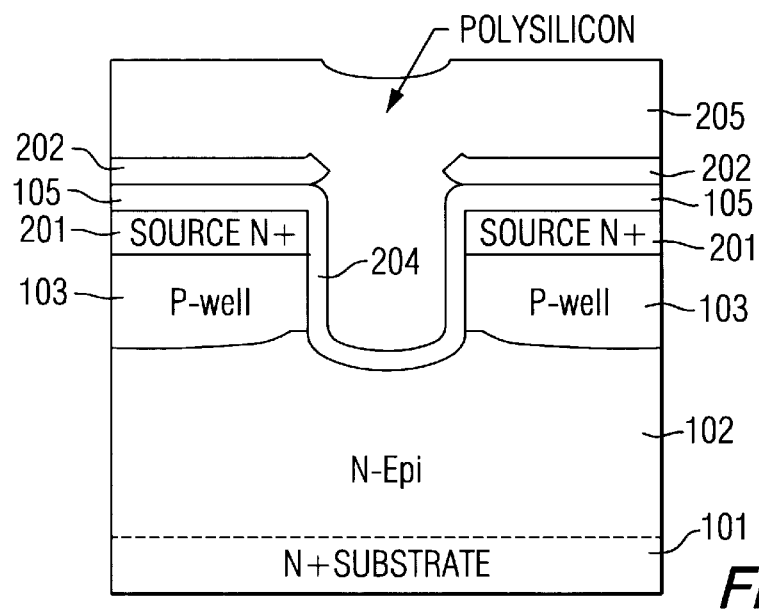
Figure 23:
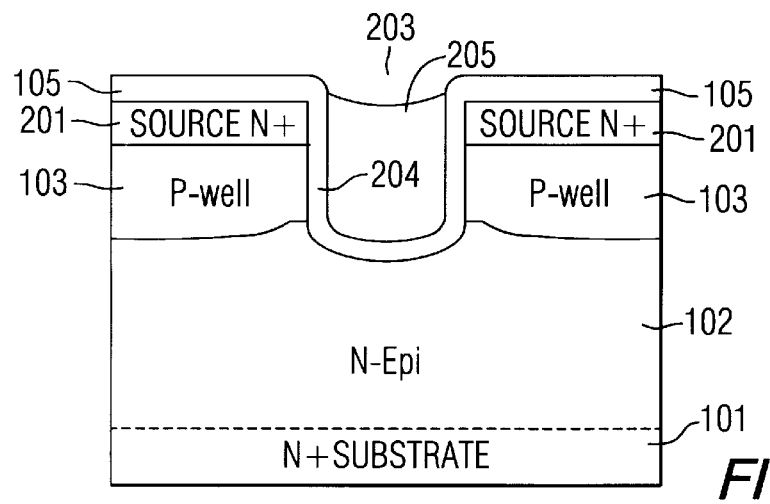
Figure 24:
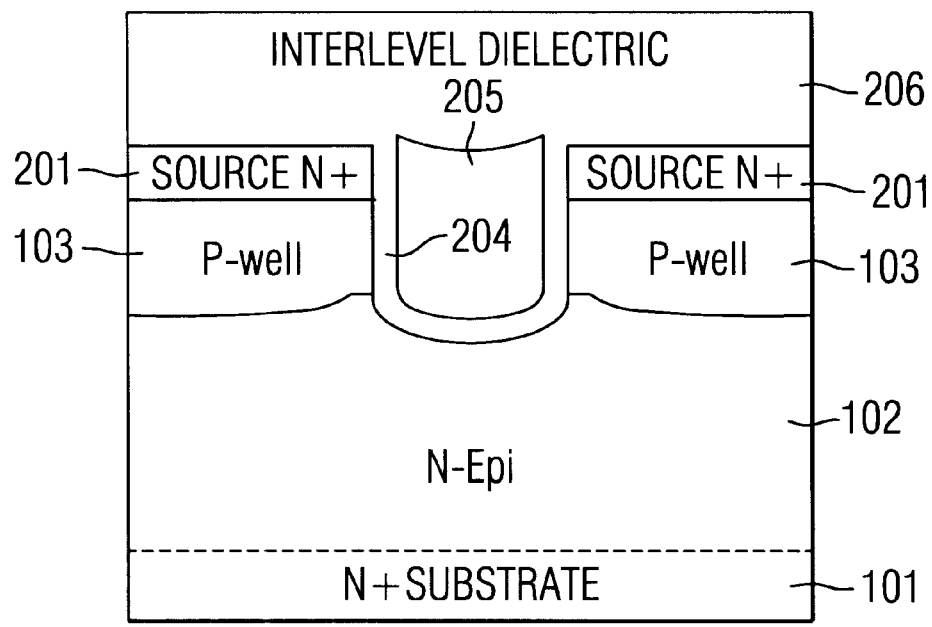
Figure 25:
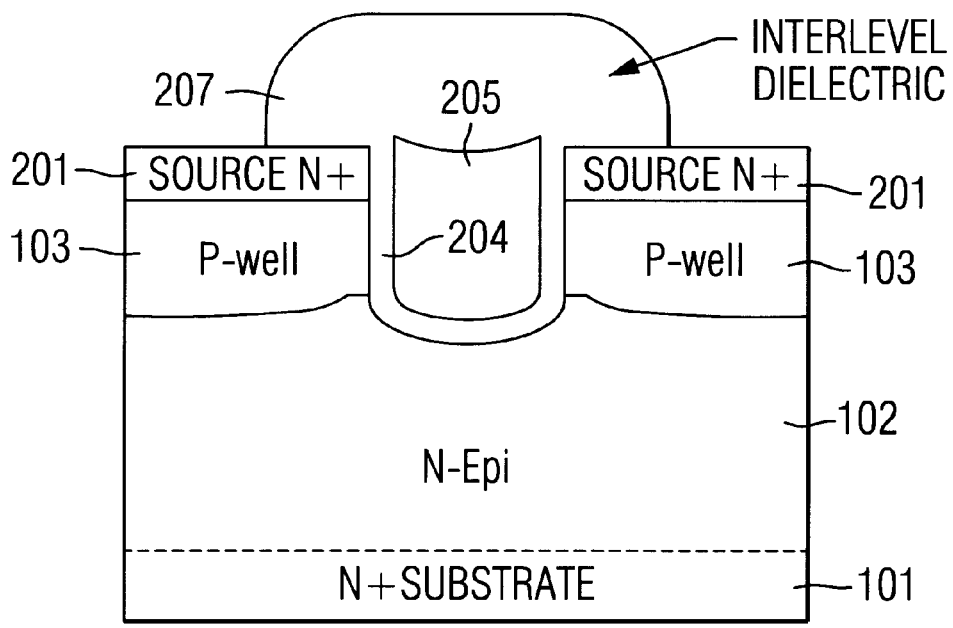

The initial processing steps of depositing an epitaxial layer 102 on top of a substrate, followed by growth of screen oxide 105 and implantation to form P-well 103 (FIGS. 15, 16, 17) are similar to those of the described prior art (cf. FIGS. 1, 2, 3). At this point there is a departure from the steps of the described prior art process. Rather than using a non-self aligned photoresist procedure to define P+ as provided by the described prior art, an N+ implantation of, for example, arsenic or phosphorus ions, is employed to form an N+ source 201, followed by deposition of a nitride layer 202 (FIGS. 18 and 19). A trench 203 is defined by a photoresist mask TM. Nitride layer 202 and screen oxide layer 105 are etched to form a hard mask, and trench 203 is etched into layer 102 (FIG. 20). Gate oxide 204 is grown inside trench 203 (FIG. 21), followed by deposition of polysilicon 205 (FIG. 22). The thermal growth of gate oxide also drives P-well 103. Some designs or insufficient thermal budget during gate oxidation might require a separate P-well drive step to drive it to the desired depth. Planarization leaves polysilicon 205 in trench 203, and a standard etching procedure removes nitride layer 202 (FIG. 23). An interlevel dielectric material 206 is deposited (FIG. 24) and selectively etched by standard masking techniques to provide a patterned interlevel dielectric 207 and a contact area 208 to source 201 (FIG. 25).

Figure 26:
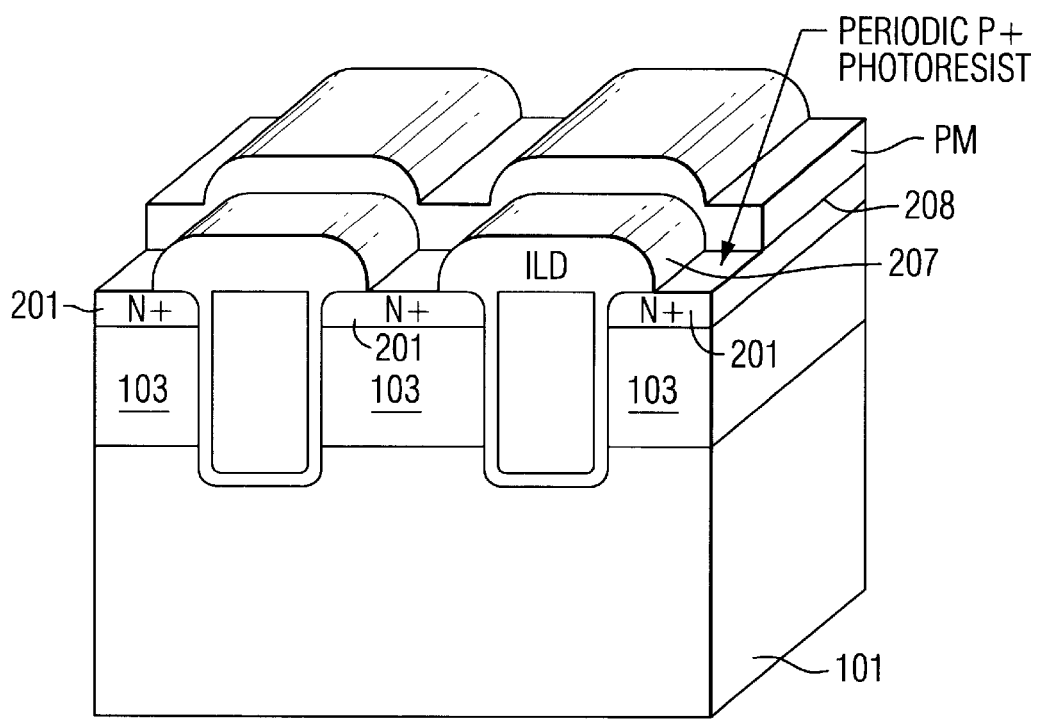
FIGS. 26–29 are three-dimensional representations of the formation of body and source regions in a device formed in accordance with the present invention.
Figure 27:
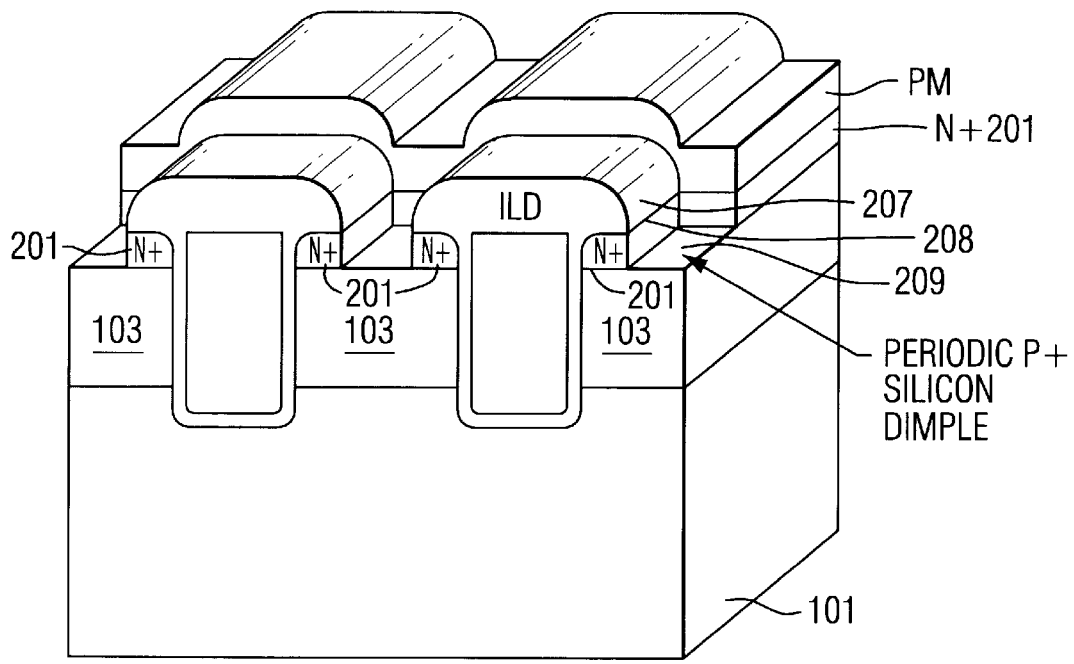
Figure 28:
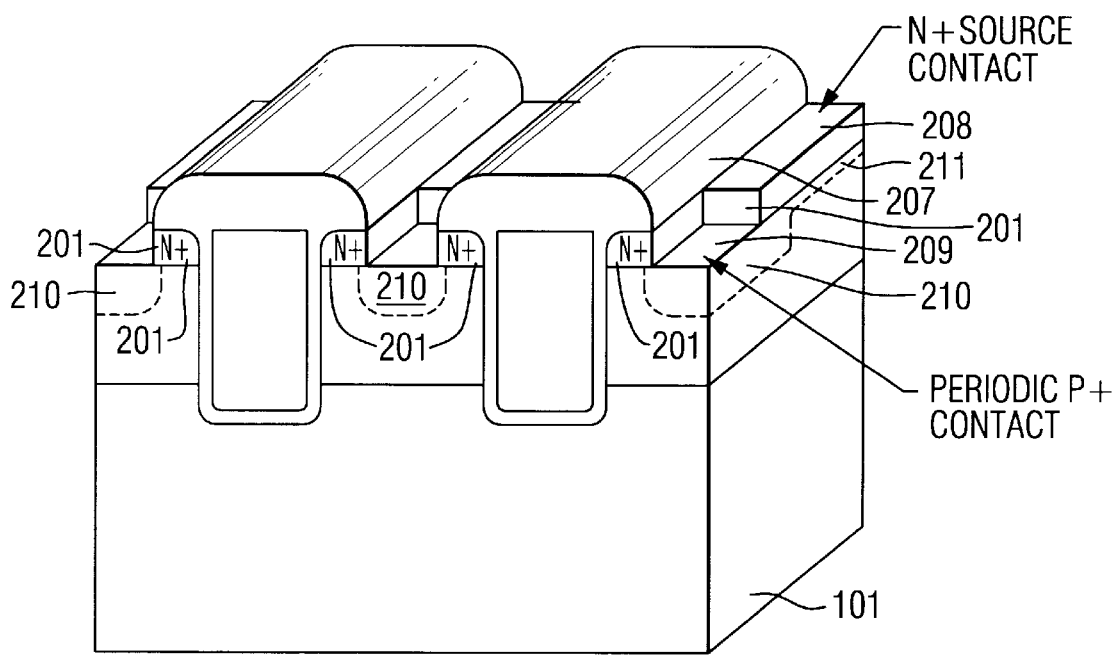

At this point, in accordance with the present invention, an innovative self-aligned periodic P+ body is formed in the device. A photoresist layer, depicted as a stripe mask PM disposed transversely to contact area 208, is formed (FIG. 26). Mask PM, whose parallel direction is defined by patterned interlevel dielectric 207 and contact area 208, is noncritically aligned to previous layers and thus, unlike prior art processes, does not affect the size of the device. A shallow dimple etch of the wafer is carried out to form a P+ contact area 209 (FIG. 27). The portion of N+ source 201 and planar N+ contact area 208 is protected by mask PM and thus is not etched. Following stripping of mask PM by standard methods, a P+ implant of, for example, boron into the contact area 209 formed by the shallow dimple etch results in formation of a deep P+ body 210 (FIG. 28). Alternatively, the deep P+ body 210 can be implanted prior to stripping of mask PM. The P+ implant also results in the formation of a shallow body region 211 underlying source contact area 208.

A low thermal budget step, i.e., lower temperature and/or shorter time, than is typically used in the prior art is employed only to activate the P+ implant, there now being no need to diffuse the P+ body 210 deeper into the substrate. The formation of device 200 of the present invention is completed by the deposition of a layer of metal 212 on the device surface that contacts both the N+ source and P+ body regions 201 and 210, respectively, and another layer of metal (not shown) to provide drain contact on the back side (FIG. 29).

Figure 29:
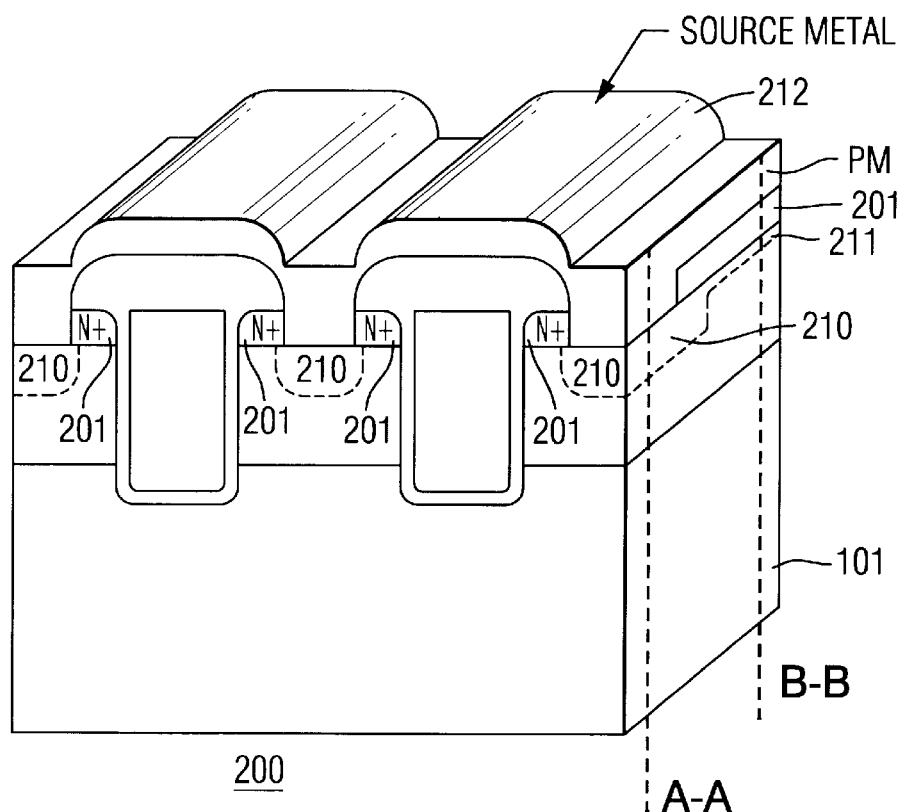
Figure 30:
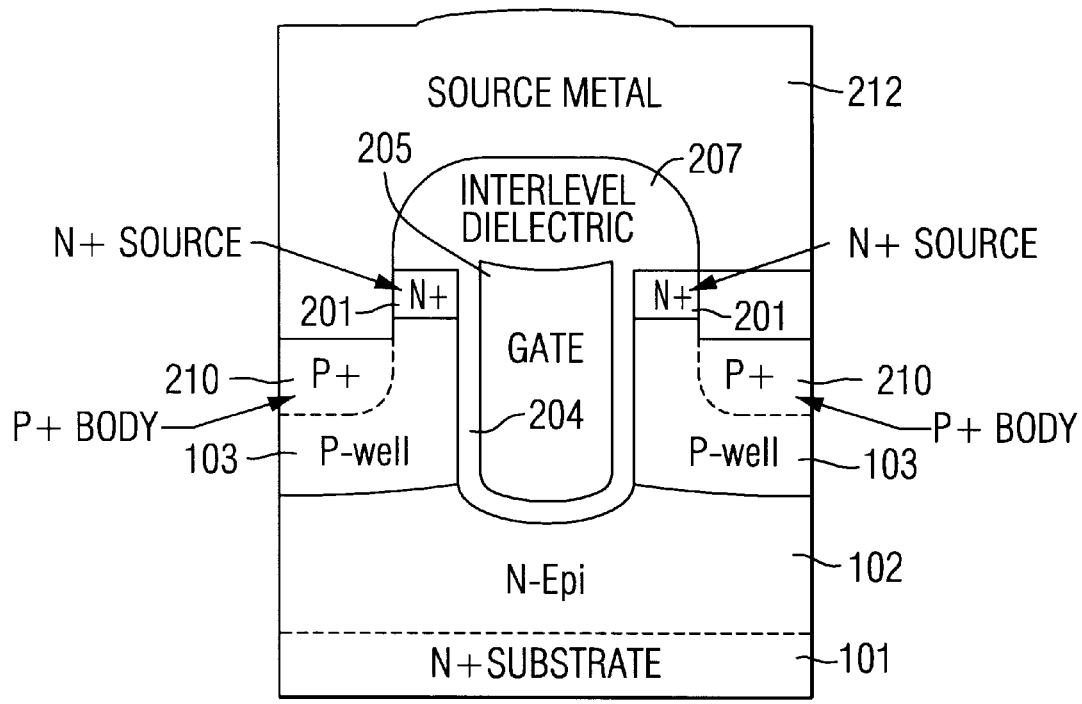
FIGS. 30 and 31 are cross-sections of FIG. 29 illustrating a device made by the process of the present invention.
Figure 31:
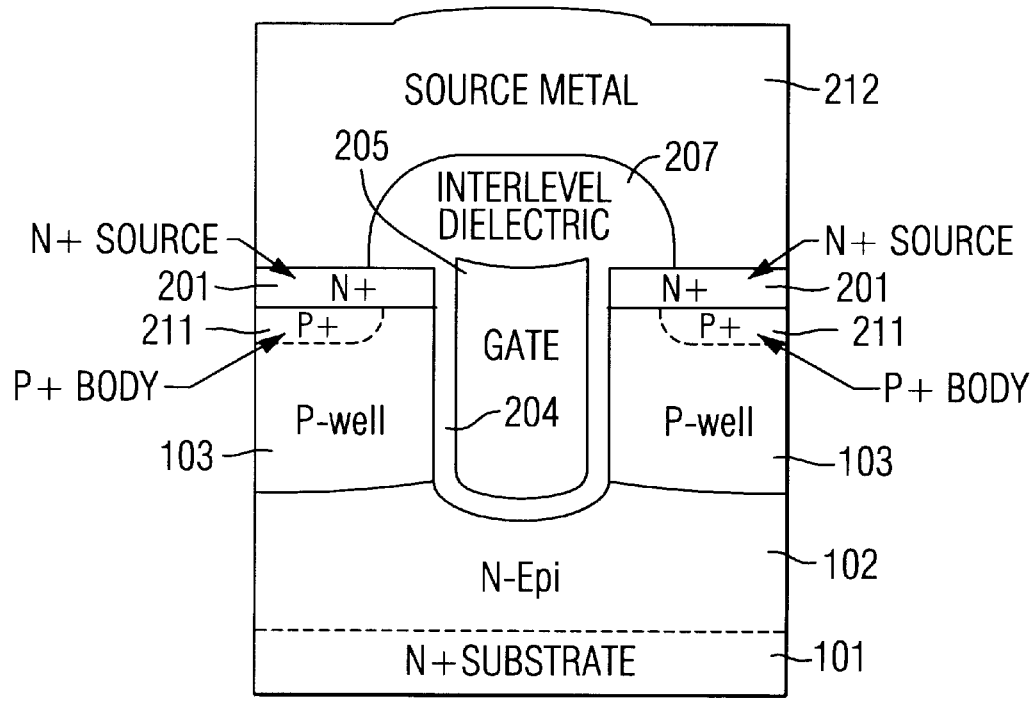

FIG. 30 shows a cross-section A—A of FIG.29 through the P+ body contact region of a device 200 formed by the process of the present invention, and FIG. 31 shows a cross-section B—B of FIG. 29 through the N+ source contact region of the device 200. The shallow etched P+ body contact area 209, into which the P+ implant was made to form deep P+ body 210, preferably is smaller than the portion of the N+ source contact area 208 protected by the PM mask.

The process of the present invention for forming a high density trench MOS-gated power device, as illustrated by FIGS. 15–31, allows a substantial reduction in its size while preserving the advantages of a deep P+ body design. In the process of the invention, a periodic shallow dimple etch of the surface of the wafer is carried out to form a recess of a desired depth below the substrate top surface. Since this etch is self-aligned to the contact opening, no critical alignment photoresist masking steps are required. Because of the recess in the surface, the P+ implant is implanted deep into the silicon, and a subsequent low thermal budget step is used only to activate the dopants and not to diffuse the P+ body deep into the substrate. The resulting device can be made smaller because of the shorter lateral distance needed to prevent the P+ high dose boron from reaching the channel area. An additional benefit is the P+ body self-alignment, which avoids any additional size increase necessitated by tolerance for misalignment in a photoresist masking process. The reduction in device size provided by the present invention substantially improves device efficiency and power handling capability.

The invention has been described in detail for the purpose of illustration, but it is understood that such detail is solely for that purpose, and variations can be made therein by those skilled in the art without departing from the spirit and scope of the invention, which is defined by the following claims.

What is claimed:

1. A high density MOS-gated device comprising:
   a semiconductor substrate;
   a doped upper layer of a first conduction type disposed on said substrate, said upper layer comprising a heavily doped source region of said first conduction type and a doped well region of a second and opposite conduction type at an upper surface of said upper layer, said upper surface comprising a contact area for said source region, said upper surface further comprising a recessed portion comprising a contact area for a heavily doped deep body region of said second conduction type in said upper layer, said deep body region underlying said recessed portion; and
   a trench gate disposed in said upper layer, said gate comprises a conductive material separated from said upper layer by an insulating layer.

2. The device of claim 1 further comprising a shallow body region underlying said source region contact area.

3. The device of claim 1 further comprising a metal contact on said source region contact area and on said body region contact area in said recessed portion in said upper surface of said upper layer.

4. The device of claim 1 wherein said upper layer is included within said substrate.

5. The device of claim 1 wherein said upper layer comprises an epitaxial layer.

6. The device of claim 1 wherein said first conduction type is N and said second conduction type is P.

7. The device of claim 1 wherein said substrate comprises monocrystalline silicon and said insulating layer comprises silicon dioxide.

8. The device of claim 1 wherein said conductive material in said trench gate comprises highly doped polysilicon.

9. The device of claim 1 wherein said interlevel dielectric material is borophosphosilicate glass or phosphosilicate glass.

10. The device of claim 1 wherein said body contact area is smaller than said source contact area.

11. The device of claim 1 selected from the group consisting of a power MOSFET, an insulated gate bipolar transistor, and an MOS-controlled thyristor.

12. A process for forming a high density MOS-gated device, said process comprising:
   providing a semiconductor substrate comprising a doped upper layer of a first conduction type, said upper layer having an upper surface;
   forming a doped well region of a second and opposite conduction type in said upper surface of said upper layer;
   implanting a dopant of said first conduction type in said well region, thereby forming a heavily doped source region in said well region;
   forming a layer of nitride on said upper surface of said upper layer;
   selectively etching said nitride layer and said upper layer, thereby forming a trench in said upper layer;
   lining said trench with an insulating layer, then filling said trench with a conductive material, thereby forming a trench gate;
   removing said nitride layer and forming a layer of interlevel dielectric material on said trench gate and said upper surface of said upper layer;
   selectively etching said interlevel dielectric layer, thereby forming a source region contact area;
   selectively etching said source region, thereby forming a shallow recess in said source region, said recess comprising a body region contact area; and
   implanting a dopant of said second conduction type into said recess, thereby forming a deep body region underlying said recess.

13. The process of claim 12 further comprising:
   forming a screen layer of oxide on said upper surface of said upper layer prior to forming said nitride layer.

14. The process of claim 12 further comprising:
   implanting a dopant of said second conduction type into said source region contact area, thereby forming a shallow body region underlying said source region contact area.

15. The process of claim 12 further comprising:
   forming a metal contact on said source region contact area and on said body region contact area.

16. The process of claim 12 wherein said upper layer is included within said substrate.

17. The process of claim 12 wherein said upper layer comprises an epitaxial layer.

18. The process of claim 12 wherein said first conduction type is N and said second conduction type is P.

19. The process of claim 12 wherein said substrate comprises monocrystalline silicon and said insulating layer comprises silicon dioxide.

20. The process of claim 12 wherein said conductive material in said trench gate comprises highly doped polysilicon.

21. The process of claim 12 wherein said dopant of a first conduction type comprises arsenic or phosphorus.

22. The process of claim 12 wherein said dopant of a second conduction type comprises boron.

23. The process of claim 12 wherein said interlevel dielectric material comprises borophosphosilicate glass or phosphosilicate glass.

24. The process of claim 12 wherein said body contact area is smaller than said source contact area.

25. The process of claim 12 wherein said device is selected from the group consisting of a power MOSFET, an insulated gate bipolar transistor, and an MOS-controlled thyristor.

26. In an improved process for forming a high density MOS-gated device including the steps of forming a gate trench in an upper layer of a substrate, forming a well region in the upper layer, implanting a dopant of a first conduction type into the well region to form a source region in the well region adjacent to the gate trench, the improvement comprising:

selectively etching a portion of the source region, thereby forming a recess comprising a body region contact area, the unetched portion of said source region comprising a source region contact area; and implanting a dopant of a second conduction type into the recess, thereby forming a deep body region underlying said recess.

27. The process of claim 26 further comprising:

implanting a dopant of said second conduction type into said source region contact area, thereby forming a shallow body region underlying said source region contact area.

28. The process of claim 26 further comprising:

forming a metal contact on said source region contact area and on said body region contact area.

29. The process of claim 26 wherein said upper layer is included within said substrate.

30. The process of claim 26 wherein said upper layer comprises an epitaxial layer.

31. The process of claim 26 wherein said first conduction type is N and said second conduction type is P.

32. The process of claim 26 wherein said substrate comprises monocrystalline silicon and said insulating layer comprises silicon dioxide.

33. The process of claim 26 wherein said conductive material in said trench gate comprises highly doped polysilicon.

34. The process of claim 26 wherein said body contact area is smaller than said source contact area.

* * * * *